(12) United States Patent
Johnson et al.

(10) Patent No.: US 6,744,493 B1
(45) Date of Patent: Jun. 1, 2004

(54) IN-VACUUM EXPOSURE SHUTTER

(75) Inventors: Terry A. Johnson, Brentwood, CA (US); William C. Replogle, Livermore, CA (US); Luis J. Bernardez, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/610,239

(22) Filed: Jul. 5, 2000

(51) Int. Cl.7 .......................... G03B 27/72; G03B 27/54
(52) U.S. Cl. ............................................. 355/71; 355/67
(58) Field of Search ........................ 355/67–71, 53; 396/488, 491–496

(56) References Cited

U.S. PATENT DOCUMENTS

| | | | |
|---|---|---|---|
| 3,980,407 A | * 9/1976 | Hill | 355/71 |
| 4,141,638 A | * 2/1979 | Ooba | 354/246 |
| 4,227,210 A | * 10/1980 | Nixon | 358/113 |
| 4,227,792 A | 10/1980 | Rentschler | 354/230 |
| 4,334,744 A | 6/1982 | Shelton | 354/27 |
| 4,514,064 A | 4/1985 | Kurosu et al. | 354/234.1 |
| 5,043,753 A | * 8/1991 | Nakamori | 354/247 |
| 5,415,753 A | 5/1995 | Hurwitt et al. | 204/192.12 |
| 5,712,698 A | * 1/1998 | Poschenrieder et al. | 355/71 |
| 5,871,588 A | 2/1999 | Moslehi et al. | 118/730 |
| 5,948,166 A | 9/1999 | David et al. | 118/718 |
| 6,006,040 A | 12/1999 | Aosaki et al. | 396/242 |
| 6,097,474 A | * 8/2000 | McCullough et al. | 355/69 |
| 6,190,060 B1 | * 2/2001 | Tachihara et al. | 396/488 |
| 6,252,935 B1 | * 6/2001 | Stynol et al. | 378/137 |

* cited by examiner

Primary Examiner—Henry Hung Nguyen
(74) Attorney, Agent, or Firm—Fliesler Meyer LLP

(57) ABSTRACT

An in-vacuum radiation exposure shutter device can be employed to regulate a large footprint light beam. The shutter device includes (a) a source of radiation that generates an energy beam; (2) a shutter that includes (i) a frame defining an aperture toward which the energy beam is directed and (ii) a plurality of blades that are secured to the frame; and (3) device that rotates the shutter to cause the plurality of blades to intercept or allow the energy beam to travel through the aperture. Each blade can have a substantially planar surface and the plurality of blades are secured to the frame such that the planar surfaces of the plurality of blades are substantially parallel to each other. The shutter device is particularly suited for operation in a vacuum environment and can achieve shuttering speeds from about 0.1 second to 0.001 second or faster.

24 Claims, 2 Drawing Sheets

IN-VACUUM EXPOSURE SHUTTER

This invention was made with Government support under Contract No. DE-AC04-94AL85000 awarded by the U.S. Department of Energy to Sandia Corporation. The Government has certain rights to the invention.

FIELD OF THE INVENTION

This invention relates to a shutter device, and more particularly, to a vacuum compatible fast shutter device that is suited for controlling a beam of radiation in photolithographic equipment used in the manufacture of integrated circuits.

BACKGROUND OF THE INVENTION

In general lithography refers to processes for pattern transfer between various media. Projection lithography is a powerful and essential tool for microelectronics processing. FIG. 4 schematically depicts an apparatus for EUV lithography that comprises a radiation source 21, such as a synchrotron or a laser plasma source, that emits x-rays 22 into condenser 13 which in turn emits beam of light 14 that illuminates a portion of reticle or mask 15. The emerging patterned beam is introduced into the imaging optics 16 which projects an image of mask 15, shown mounted on mask stage 17, onto wafer 18 which is mounted on stage 19. Element 20, an x-y scanner, scans mask 15 and wafer 18 in such direction and at such relative speed as to accommodate the desired mask-to-image reduction. It may be necessary to shutter the radiation at various positions along the optical path(s) of the radiation. Mechanisms must be in place in the projection lithography system to accomplished this precisely and quickly for a light beam with a large footprint.

SUMMARY OF THE INVENTION

The present invention is directed to an in-vacuum exposure shutter that is capable of shuttering a large footprint light beam in a short time in a vacuum environment. The in-vacuum exposure shutter can be employed in any process or product that requires precise temporal control over a large footprint light beam.

In one aspect, the invention is directed to an exposure device that includes:

a source of radiation that generates an energy beam;

a shutter that includes (i) a frame defining an aperture toward which the energy beam is directed and (ii) a plurality of blades that are secured to the frame; and means for rotating the shutter to cause the plurality of blades to intercept or allow the energy beam to travel through the aperture.

In one embodiment, each blade has a substantially planar surface and the plurality of blades are secured to the frame such that the planar surfaces of the plurality of blades are substantially parallel to each other. The exposure device is particularly suited for operation in a vacuum environment and can achieve shuttering time from about 0.1 second to 0.001 second or shorter.

DETAILED DESCRIPTION OF THE PREFERRED EMBODIMENTS

Figure 1:
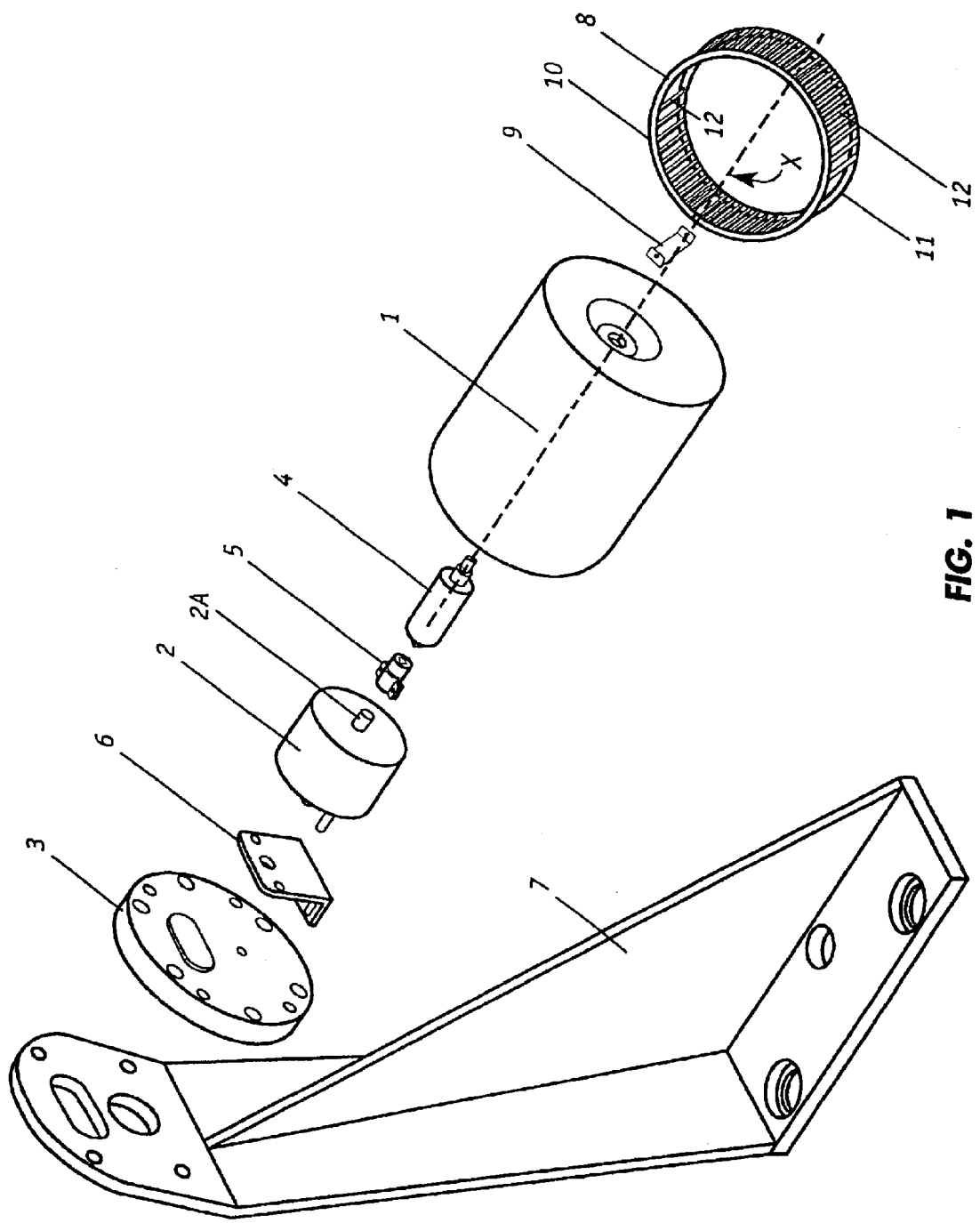
FIG. 1 illustrates an embodiment of the exposure shutter of the present invention.

FIG. 1 illustrates an embodiment of the exposure shutter which includes a support stand 7 onto which is secured solenoid 2 by solenoid cover 3 and solenoid bracket 6. The output shaft 2A of solenoid 2 is connected to shutter frame 8 by a solenoid mount 5, rotary feedthrough 4, and shaft coupling 9. For non-vacuum operations, any suitable rotating device can be employed, for vacuum operations an electrically driven motor or solenoid is preferred. The rotary feedthrough is also preferably employed for vacuum operations. A preferred rotary feedthrough is a ferrofluidic feedthrough which comprises a ferrofluidic seal which provides a hermetic seal against gas and other contaminants in vacuum conditions where a rotary shaft has to be sealed. Ferrofluidic feedthroughs are commercially available from Ferrofluidics Co. Nashua, N. H. For vacuum operations, the solenoid is preferably encased in housing 1 that is essentially impermeable to gas. The housing entraps contaminants that may be discharged from the solenoid.

The shutter frame 8 supports a plurality of shutter blades (not shown) which can intercept radiation (e.g., energy beam) as the frame rotates about center axis x where the frame is attached to the shaft coupling 9 which functions as a pivot. By "energy beam" is meant any flux of electromagnetic radiation (coherent or incoherent) of any frequency including visible light. The shutter frame or wheel includes two circular ring-like members 10, 11 that are rigidly held together by a plurality of posts 12 onto which shutter blades are attached. The shutter frame is preferably made of any lightweight metal such as aluminum.

Figure 2:
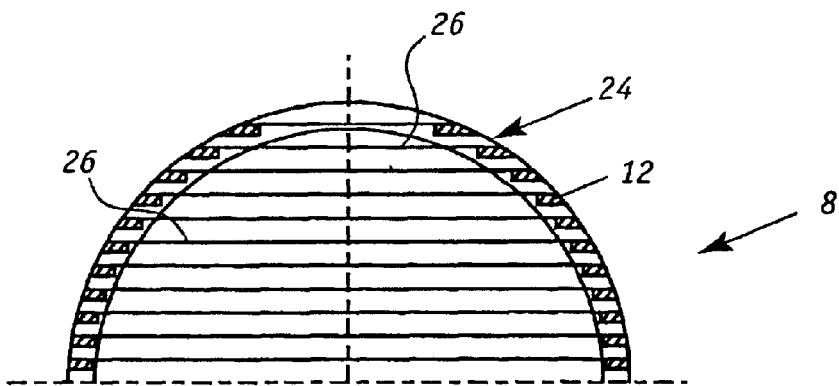
FIG. 2 illustrates the shutter frame.

FIG. 2 illustrates a partial cross-sectional view of the shutter frame 8 showing the plurality of posts 12 supporting shutter blades 26. The shutter frame should be sufficiently stiff to ensure that there would be little deformation due to the force of the tension created by the shutter blades. One method of attaching a shutter blade is to pass aluminum strips through the rectangular slots 24 in the side between the posts 12 and then winding the strips tightly around the posts. Epoxy is then applied to the flats created by the slots. Thereafter, the strip is held with the weight of the frame providing the force that maintains the strip substantially planar as the epoxy cures. Once the epoxy has cured, excess strip is trimmed off and the process is repeated until all the shutter blades are fabricated. The shutter blades should be parallel to each other so that there is minimum attenuation of the radiation when the shutter device is in the open position.

The shutter blades are made of thin strips of any suitable material that is non-transparent to the radiation of interest. For example, the blades can be made of metal such as aluminum, steel, nickel, or titanium or plastic such as vinyl, polytetrafluoroethylene (e.g., TEFLON), polyimide (e.g., KAPTON), polyester, polyamide (e.g, NYLON), or polypropylene.

The thickness of the shutter blades will depend on, among other things, the wavelength of the radiation and its intensity. Preferably, the shutter blades will be as thin as practical in order to minimize attenuation. Where the radiation is extreme ultraviolet EUV radiation having a wavelength of about 10 nm to 20 nm (EUV) the thickness of a metal shutter will typically range from 0.002 mm to 0.2 mm. The width of each shutter blade will typically range from 0.5 cm to 10 cm.

In preferred embodiments of the exposure shutter, the selection of (i) shutter blade thickness and (ii) number of shutter blades should minimize the attenuation of the intensity of the radiation that passes through the aperture of the shutter frame in the open position. In addition, the exposure device should be in the fully closed position when the shutter blades have been rotated between 1 degree to 45 degrees and preferably between 5 degrees and 15 degrees along an axis that is parallel to the plane of the shutter frame aperture. This angle is determined by the width of the blades and the distance between them.

The exposure device can be readily scaled to accommodate energy beams having different size footprints. The major design limitations are the speed and shutter actuator torque requirements. The energy beam can comprise radiation having any wavelength, for example, of from 0.1 nm to 1 mm. The energy beams can be generated from any source including, for example, lasers, discharge sources, and synchrotrons. Appropriate lens and mirrors can be employed to generate substantially collimated beams for photolithography applications. It is expected that the exposure device can shutter energy beams that have cross sectional areas of from 5 $cm^2$ to 30,000 $cm^2$ or more. Typically for EUV photolithography applications, the radiation will have a footprint or cross sectional areas of from 5,000 $cm^2$ to 10,000 $cm^2$. The exposure device is expected to operate in vacuum systems having a pressure that typically ranges from 0.1 torr to $10^{-8}$ torr, or less.

Figure 3A:
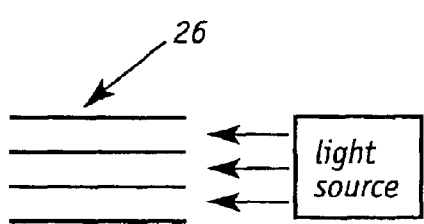
FIGS. 3A and 3B illustrate operation of the shutter blades.
Figure 3B:
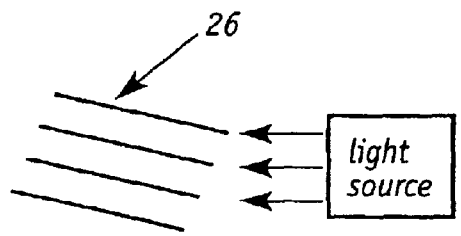
Figure 4:
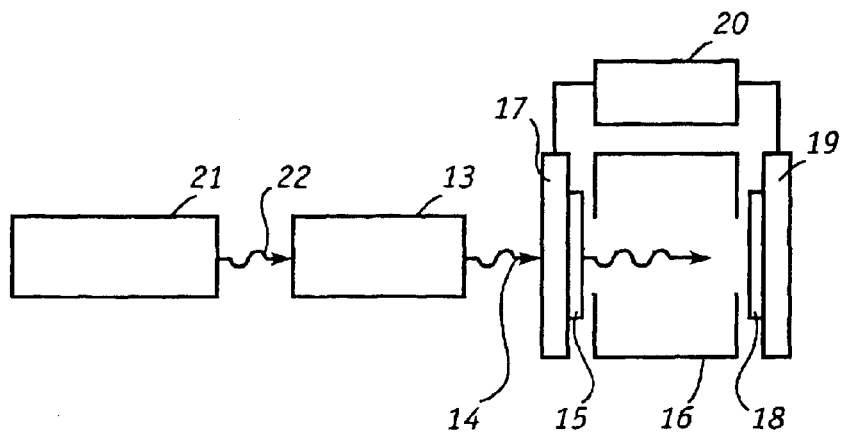
FIG. 4 illustrates a photolithography system.

FIGS. 3A and 3B illustrate operations of shutter blades 26. As shown in FIG. 3A, in the open position the shutter blades 26 are oriented parallel to the light path so that only a small amount of attenuation occurs. In the closed position, the frame is rotated just enough so that adjacent shutter blades overlap and the light is completely blocked as shown in FIG. 3B. As is apparent, since the energy beams travel along the width of the shutter blades, the closer adjacent blades are positioned, the shorter will be the distance of rotation of the frame needed to fully shutter the energy beam. However, the amount attenuation of the radiation when the shutter is in the open position also increases with the number of shutter blades used.

The rotary solenoid is used to move the shutter frame from the open to closed position in a short amount of time. The solenoid provides the required high torque output through a short distance. Typically, the larger the solenoid the faster the speed of rotation. Typically the drive means will move the frame from the open position to the closed position or from the closed position to the open position in a period of time ranging from 0.001 second to 0.1 second, or shorter. For EUV photolithography applications, this time period preferably ranges from 0.010 second to 0.001 second or shorter. Aside from the fully "open" and "closed" positions, it is understood that the solenoid can also be designed to move the shutter frame in and out of "intermediate" positions where the radiation is only partially intercepted. Another technique of increasing the speed of the shutter frame is to decrease the rotational moment of inertia about the solenoid shaft axis by minimizing the frame weight, with the proviso that it is also necessary to provide the frame with sufficient integrity and strength to withstand the force of the shutter blades that are stretched tightly between the sides of the shutter frame.

An exposure shutter similar to that shown in FIG. 1 was fabricated and tested to shutter a visible light beam that had a diameter of approximately 4 inches (10.2 cm). The solenoid used was model Ultimag 5EM from Lucas Control Systems Products, Vandalia, Ohio. The rotary feedthrough was model SS-188-SLAA from Ferrofluidic Co. The visible light beam was generated by a helium/neon laser. The aluminum shutter frame had a 4 inch (10.2 cm) diameter and supported 22 aluminum shutter blades that were each 0.001 in. thick (0.0254 mm) and 1 in. (2.54 cm) wide. The shutter blades were spaced 0.15 in. (0.38 cm) apart. For this configuration, there was less than 1% transmittance loss (i.e., attenuation) when the shutter blades were in the open position. The activated solenoid rotated the shutter frame 10 degrees in about 7 msec. to completely shutter the light beam. A feature of the exposure device employing the shutter blades is that the shutter blocked light nearly simultaneously as the shutters closed. This is in contrast to iris type shutters that block the light from the outside in and to the slide type of shutters that block the light from one side to another. Another feature of the shutter is that in the closed position it requires no power to be applied which limits heat generation, wear of the solenoid, and contamination.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An exposure device comprising:
    a source of radiation that generates an energy beam;
    a shutter that includes (i) a frame defining an aperture toward which the energy is directed and (ii) a plurality of blades that are secured to the frame;
    pivot means for pivoting the frame such that the plurality of blades rotate about an axis that is normal to the substantially planar surfaces of the plurality of blades; and
    drive means for moving the frame in a controlled manner, (i) from an open position that allows the energy beam to travel through the aperture to a closed position that intercepts the energy beam and (ii) from the closed position to the open position.

2. The exposure device of claim 1 wherein each blade has a substantially planar surface and the plurality of blades are secured to the frame such that the planar surfaces of the plurality of blades are substantially parallel to each other.

3. The exposure device of claim 1 wherein the means for rotating the shutter frame comprise a solenoid that is encased in a vacuum compatible housing that entraps contaminants from the solenoid.

4. The exposure device of claim 1 wherein each blade has a width that ranges from about 0.5 cm to 10 cm.

5. The exposure device of claim 1 wherein the light beam is a substantially collimated beam that has a cross set area of from about 5 $cm^2$ to 30,000 $cm^2$.

6. The exposure device of claim 1 wherein each blade is made from a metal that is selected from the group consisting of aluminum, steel, nickel, and titanium.

7. The exposure device of claim 1 wherein each blade is made from a plastic that is selected from the group consisting of vinyl, polytetrafluoroethylene, polyimide, polyester, polyamide, and polypropylene.

8. The exposure device of claim 1 wherein the source of radiation generates radiation having a wavelength of from about 0.1 nm to 1 mm.

9. The exposure device of claim 1 wherein the aperture has an area of between about 5 $cm^2$ to 30,000 $cm^2$.

10. The exposure device of claim 1 wherein in the open position the substantially planar surface of each blade of the plurality of blades is parallel to the path of the energy beam when the frame is in the open position.

11. The exposure device of claim 1 wherein the drive means comprises means for moving the frame from the open position to the closed position or from the closed position to the open position within a time period that ranges from about 0.001 second to 0.1 second.

12. The exposure device of claim 1 wherein at least 90% of the intensity of the energy beam passes through the aperture when the frame is in the open position.

13. A method of patterning a substrate through controlled exposure of the substrate in a vacuum system which comprises the steps of:

generating radiation comprising an energy beam;

controlling the exposure with an exposure device that comprises a shutter that includes (i) a frame defining an aperture toward which the energy beam is directed and (ii) a plurality of blades that are secured to the frame;

pivot means for pivoting the frame such that the plurality of blades rotates about an axis that is normal to the substantially planar surfaces of the plurality of blades; and drive means to move the frame in a controlled manner (i) from an open position that allows the energy beam to travel through the aperture and a closed position that intercepts the closed position to the open position.

14. The method of claim 13 wherein each blade has a substantially planar surface and the plurality of blades are secured to the frame such that the planar surfaces of the plurality of blades are substantially parallel to each other.

15. The method of claim 13 wherein the exposure device includes means for rotating the frame of the shutter that includes a solenoid that is encased in a vacuum compatible housing that entraps contaminants from the solenoid.

16. The method of claim 13 wherein each blade has a width that ranges from about 0.5 cm to 10 cm.

17. The method of claim 13 wherein the energy beam is a substantially collimated beam that has a cross sectional area of from about 5 cm2 to 30,000 $cm^2$.

18. The method of claim 13 wherein each blade is made from a metal that is selected from the group consisting of aluminum, steel, nickel and titanium.

19. The method of claim 13 wherein each blade is made from a plastic that is selected from the group consisting of vinyl polytetrafluoroethylene, polyamide, polyester, polyamide and polypropylene.

20. The method of claim 13 wherein the source of radiation generates radiation having a wavelength of from about 0.1 nm to 1 mm.

21. The method of claim 13 wherein the aperture has an area of between about 5 $cm^2$ to 30,000 $cm^2$.

22. The method of claim 13 wherein the substantially planar surface of each blade of the plurality of blades is parallel to the path of the energy beam when the frame is in the open position.

23. The method of claim 13 wherein the drive means comprises means for moving the frame from the open position to the closed position or from the closed position to, the open position in less than from about 0.001 second to 0.1 second.

24. The method of claim 13 wherein at least 90% of the intensity of the energy beam passes through the aperture when the frame is in the closed position.

* * * * *